(12) United States Patent
Jang et al.

(10) Patent No.: US 7,528,925 B2
(45) Date of Patent: May 5, 2009

(54) ROLL PRINTING DEVICE, ROLL PRINTING METHOD, AND METHOD OF FABRICATING LIQUID CRYSTAL DISPLAY DEVICE USING THE SAME

(75) Inventors: Hyun Seok Jang, Paju-si (KR); Cheol Joo Moon, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 375 days.

(21) Appl. No.: 11/478,379

(22) Filed: Jun. 30, 2006

(65) Prior Publication Data

US 2007/0153223 A1    Jul. 5, 2007

(30) Foreign Application Priority Data

Dec. 29, 2005   (KR) ............... 10-2005-0133128

(51) Int. Cl.
*G02F 1/13* (2006.01)
*G02F 1/1333* (2006.01)
*G02F 1/1337* (2006.01)
*B41F 31/00* (2006.01)
*B41K 1/38* (2006.01)

(52) U.S. Cl. .................. 349/187; 349/94; 349/123; 101/335

(58) Field of Classification Search ........... 349/94, 349/123

See application file for complete search history.

(56) References Cited

U.S. PATENT DOCUMENTS 4,186,661 A * 2/1980 Vieau ................ 101/178
5,070,783 A * 12/1991 Ireton ............... 101/349.1

FOREIGN PATENT DOCUMENTS

CN    1627131    6/2005
JP    05-158009  6/1996

* cited by examiner

Primary Examiner—Michelle R. Connelly-Cushwa
Assistant Examiner—Chris Chu
(74) Attorney, Agent, or Firm—McKenna Long & Aldridge LLP

(57) ABSTRACT

A roll printing device, a roll printing method, and a method of fabricating an LCD device using the same are disclosed. The roll printing device includes a dispenser, an anilox roll receiving a predetermined material dispensed from the dispenser, a doctor roll rotating in engagement with the anilox roll to uniformly coat the predetermined material on the anilox roll, a doctor blade in contact with the anilox roll to uniformly coat the predetermined material on the anilox roll, and a printing roll supplied with the predetermined material from the anilox roll. The predetermined material is uniformly coated on the anilox roll by both the doctor roll and the doctor blade.

20 Claims, 5 Drawing Sheets

ROLL PRINTING DEVICE, ROLL PRINTING METHOD, AND METHOD OF FABRICATING LIQUID CRYSTAL DISPLAY DEVICE USING THE SAME

This application claims the benefit of the Korean Patent Application No. P2005-133128, filed on Dec. 29, 2005, which is hereby incorporated by reference as if fully set forth herein. This application incorporates by reference co-pending application, Ser. No. 10/184,096, filed on Jun. 28, 2002 entitled "SYSTEM AND METHOD FOR MANUFACTURING LIQUID CRYSTAL DISPLAY DEVICES FROM LARGE MOTHER SUBSTRATE PANELS" and co-pending application, Ser. No. 11/476,919, filed on Jun. 29, 2006, entitled "METHODS OF MANUFACTURING LIQUID CRYSTAL DISPLAY DEVICES" for all purposes as if fully set forth herein.

BACKGROUND OF THE INVENTION

1. Field of the Invention

The present invention relates to a roll printing device for coating an alignment layer of a liquid crystal display (LCD) device, and more particularly, to a roll printing device that can uniformly coat an alignment layer.

2. Discussion of the Related Art

Among ultra thin flat panel display devices having a display screen of a thickness of several centimeters, LCD devices have been widely used for notebook computers, monitors, spaceships, aircrafts, etc. due to their advantageous features of low driving voltage, low power consumption, and portability.

The LCD device includes a lower substrate, an upper substrate, and a liquid crystal layer formed between the substrates, wherein the lower substrate is formed opposite the upper substrate at a predetermined interval. Alignment of the liquid crystal layer depends on whether a voltage is applied between the two substrates, and transmittance of light depends on the alignment of the liquid crystal layer, whereby an image is displayed. At this time, if the alignment of the liquid crystal layer is disordered, it is difficult to obtain a desired image. Accordingly, an alignment layer is formed to uniformly maintain an initial alignment of the liquid crystal layer.

Examples of a method for forming such an alignment layer include a rubbing alignment method and a photo-alignment method.

In the rubbing alignment method, after an alignment layer is thinly coated on a substrate, a rubbing roll wound with a rubbing cloth is rotated to arrange the alignment layer in a constant direction.

In the photo-alignment method, after an alignment layer is thinly coated on a substrate, ultraviolet (UV) rays such as polarized light or unpolarized light are irradiated toward the alignment layer to allow the alignment layer to react with the UV rays, thereby arranging the alignment layer in a constant direction.

In order to obtain an alignment layer aligned in a constant direction using the rubbing alignment method or the photo-alignment method, it is necessary to thinly coat the alignment layer on the substrate at a uniform thickness. To this end, a roll printing method has been conventionally used.

Hereinafter, a related art roll printing method will be described with reference to the accompanying drawings.

FIG. 1A is a sectional view illustrating a method of coating an alignment layer using a related art roll printing device.

First, after a structure of a related art roll printing device is described, process steps of coating an alignment layer using the roll printing device will be described.

As shown in FIG. 1A, the related art roll printing device includes a dispenser 14, a doctor roll 16, an anilox roll 18, and a printing roll 20.

The doctor roll 16 is rotated in engagement with the anilox roll 18, and the anilox roll 18 is rotated in engagement with the printing roll 20.

The printing roll 20 is attached with a printing mask 22 suitable for a coating pattern of a desired alignment material.

A method of coating an alignment layer using the aforementioned roll printing device will now be described.

First, the dispenser 14 supplies an alignment material 15 to the anilox roll 18. The alignment material supplied to the anilox roll 18 is coated on the printing mask 22 of the printing roll 20 rotating in engagement with the anilox roll 18.

A substrate 10 is mounted on a substrate stage 12. The substrate stage 12 moves in a constant direction below the printing roll 20. While the substrate stage 12 is moving, the substrate 10 mounted on the substrate stage 12 is in contact with the printing mask 22 attached to the printing roll 20 and the alignment material coated on the printing mask 22 is transferred onto the substrate 10. Thus, the alignment material is coated on the substrate 10.

The doctor roll 16 serves to uniformly coat the alignment material 15 supplied from the dispenser 14 on the anilox roll 18 while rotating in engagement with the anilox roll 18.

However, the related art roll printing method for realizing uniform coating of the alignment material using the doctor roll 16 has several problems.

First, as the size of the substrate increases, the size of the anilox roll 18 increases along with the size of the doctor roll 16 rotating in engagement with the anilox roll 18. In this case, a problem occurs in that the alignment material is not uniformly coated on a center portion of the anilox roll 18.

Referring to FIG. 1B, if the sizes of the doctor roll 16 and the anilox roll 18 increase, pressure between the doctor roll 16 and the anilox roll 18 decreases in a center portion (portion B) of the rolls 16 and 18 more seriously than the pressure between the end portions (portions A) of the rolls 16 and 18. Accordingly, the alignment material is not uniformly coated on the center portion (portion B) of the anilox roll 18.

Second, if coating is repeated, a predetermined portion of the doctor roll 16 is abraded. In this case, the alignment material is not uniformly coated on the abraded portion. For this reason, a problem occurs in that a spot is generated on a predetermined portion of the substrate.

In other words, since the doctor roll 16 is made of a rubber based material, it is abraded by the alignment material if coating is repeated, whereby the alignment material is not uniformly coated on the doctor roll 16.

SUMMARY OF THE INVENTION

Accordingly, the present invention is directed to a roll printing device, a roll printing method, and a method of fabricating an LCD using the same, which substantially obviate one or more problems due to limitations and disadvantages of the related art.

An advantage of the present invention is to provide a roll printing device in which an alignment material is uniformly coated.

Another advantage of the present invention is to provide a roll printing method in which an alignment material is uniformly coated.

Another advantage of the present invention is to provide a method of fabricating an LCD using the roll printing method.

Additional advantages and features of the invention will be set forth in part in the description which follows and in part will become apparent to those having ordinary skill in the art upon examination of the following or may be learned from practice of the invention. These and other advantages of the invention may be realized and attained by the structure particularly pointed out in the written description and claims hereof as well as the appended drawings.

To achieve these and other advantages and in accordance with the purpose of the invention, as embodied and broadly described herein, a roll printing device according to the present invention includes a dispenser, an anilox roll receiving a predetermined material dispensed from the dispenser, a doctor roll rotating in engagement with the anilox roll to uniformly coat the predetermined material on the anilox roll, a doctor blade in contact with the anilox roll to uniformly coat the predetermined material on the anilox roll, and a printing roll supplied with the predetermined material from the anilox roll.

In another aspect of the present invention, a roll printing method includes dispensing a predetermined material from a dispenser to an anilox roll, uniformly coating the predetermined material on the anilox roll, supplying the predetermined material from the anilox roll to a printing roll rotating in engagement with the anilox roll, and coating the predetermined material from the printing roll on a substrate mounted on a substrate stage, wherein the uniformly coating of the predetermined material is performed by the doctor roll rotating in engagement with the anilox roll and the doctor blade in contact with the anilox roll.

In other aspect of the present invention, a method of fabricating an LCD device includes preparing lower and upper substrates, coating an alignment layer on at least one of the lower and upper substrates, and forming a liquid crystal layer between the lower and upper substrates, wherein the coating of the alignment layer includes: dispensing an alignment material from a dispenser to an anilox roll; uniformly coating the alignment material on the anilox roll; supplying the alignment material from the anilox roll to a printing roll rotating in engagement with the anilox roll; and coating the alignment material from the printing roll on a substrate mounted on a substrate stage, wherein the uniformly coating of the alignment material on the anilox roll is performed by a doctor roll rotating in engagement with the anilox roll and a doctor blade in contact with the anilox roll.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

In the drawings.

DETAILED DESCRIPTION OF THE ILLUSTRATED EMBODIMENTS

Reference will now be made in detail to the preferred embodiments of the present invention, examples of which are illustrated in the accompanying drawings. Wherever possible, the same reference numbers will be used throughout the drawings to refer to the same or like parts.

Roll printing device and roll printing method will be described hereinafter.

First Embodiment

Figure 1A:
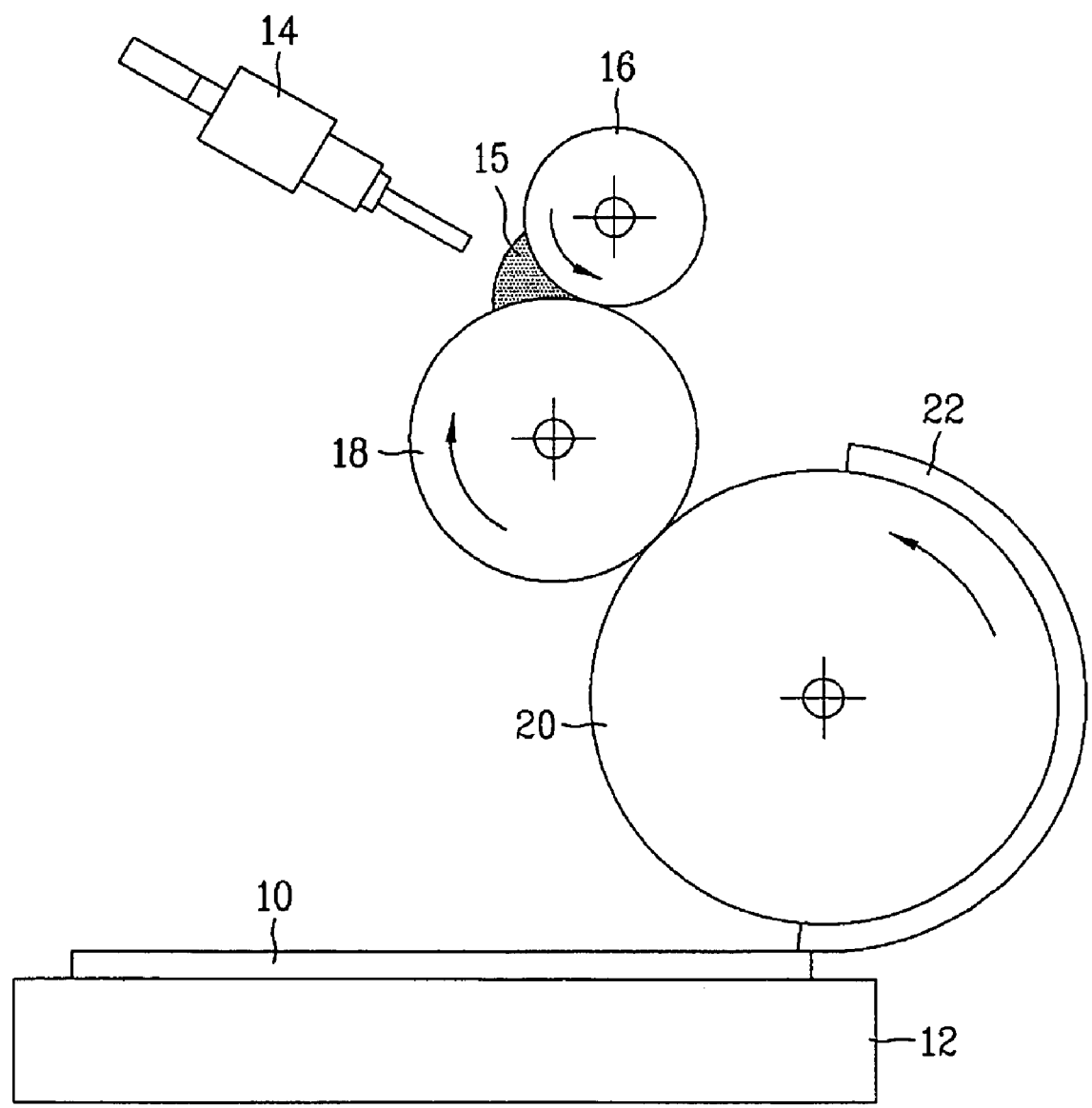
FIG. 1A is a sectional view illustrating a method of coating an alignment layer using a related art roll printing device.
Figure 1B:
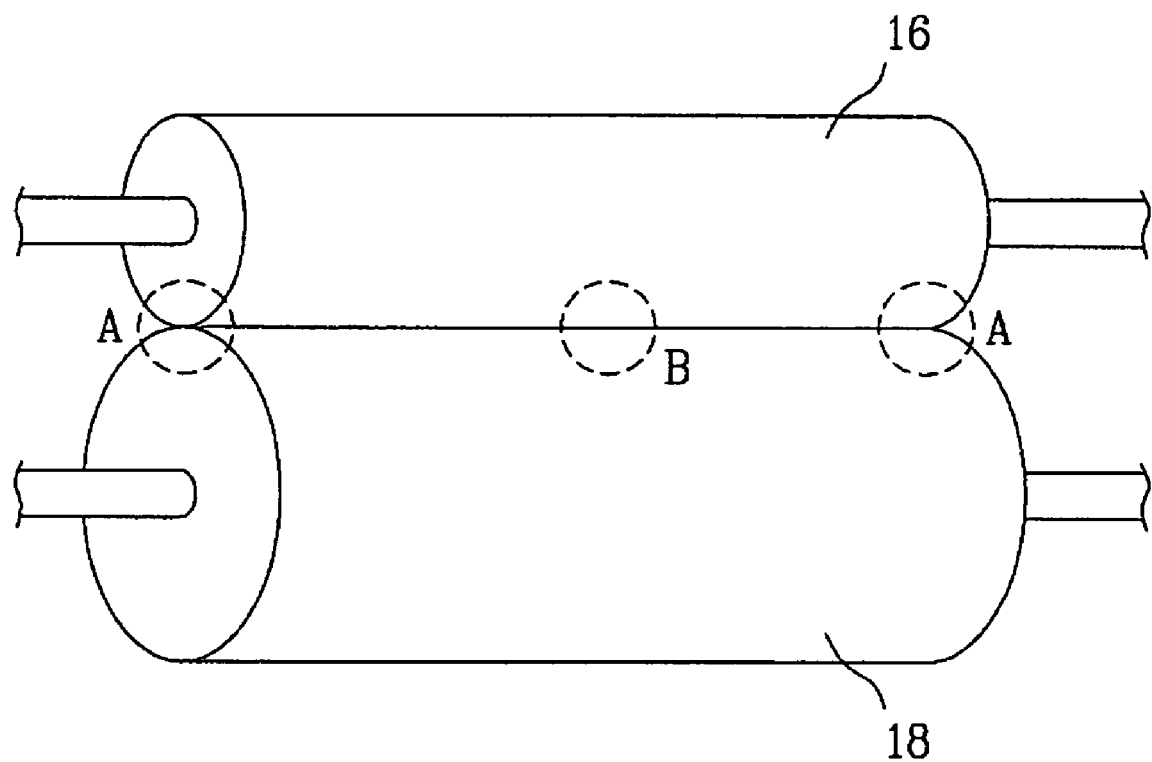
FIG. 1B is a perspective view illustrating a problem of a related art roll printing device.
Figure 2:
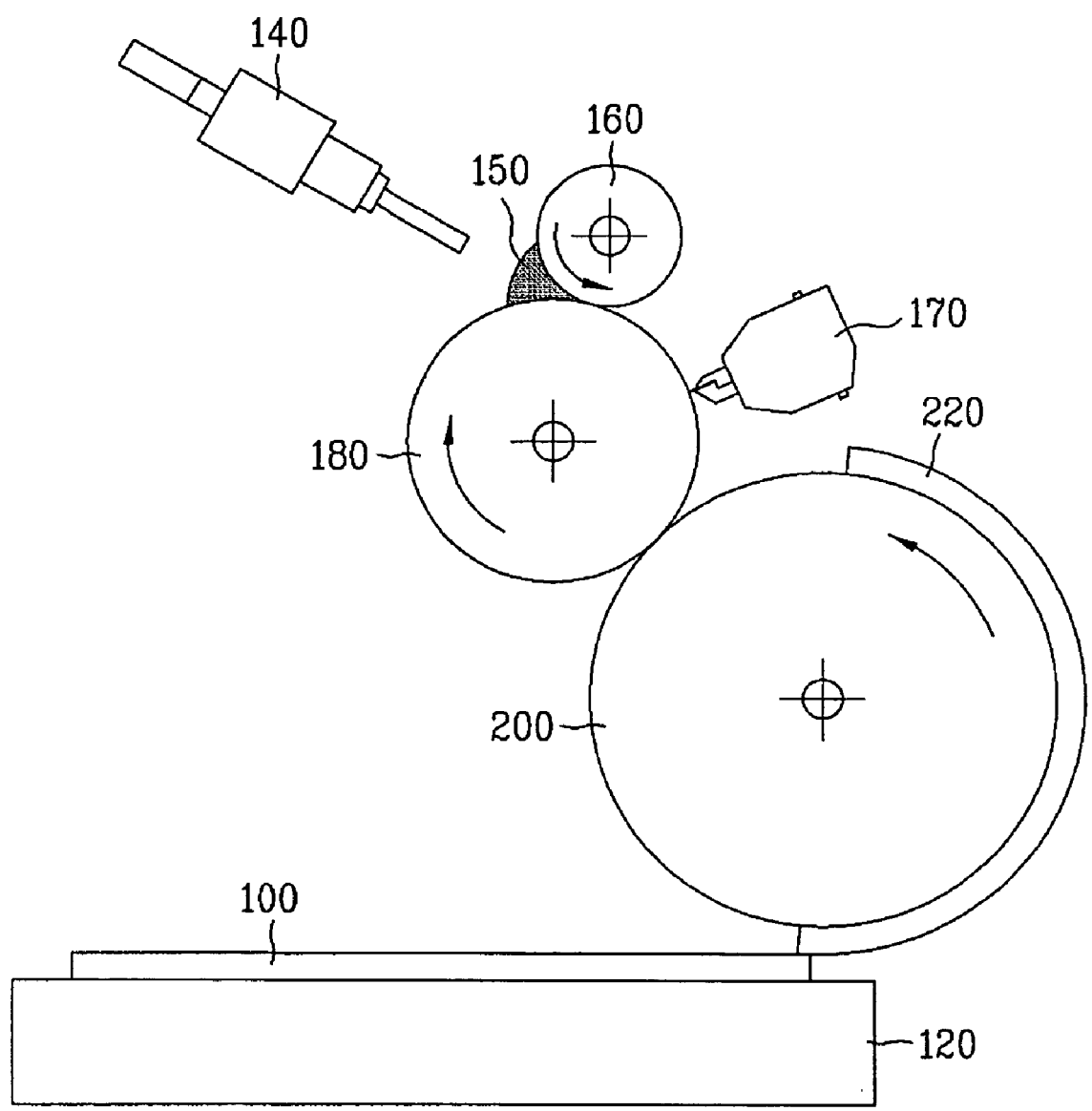
FIG. 2 is a sectional view illustrating a roll printing device according to a first embodiment of the present invention.

FIG. 2 is a sectional view illustrating a roll printing device according to a first embodiment of the present invention.

As shown in FIG. 2, the roll printing device according to the first embodiment of the present invention includes a dispenser 140, a doctor roll 160, a doctor blade 170, an anilox roll 180, a printing roll 200, and a substrate stage 120.

The dispenser 140 serves to dispense a predetermined material to the anilox roll 180, and is arranged to dispense the predetermined material between the anilox roll 180 and the doctor roll 160.

The anilox roll 180 receives the predetermined material dispensed from the dispenser 140 and moves the received material to the printing roll 200. The predetermined material is uniformly coated on the anilox roll 180 by the doctor roll 160 and the doctor blade 170 and then moves to the printing roll 200.

The printing roll 200 serves to coat the predetermined material on a substrate 100 mounted on the substrate stage 120 after receiving the predetermined material from the anilox roll 180. The printing roll 200 is attached with a printing mask 220 suitable for a coating pattern of the predetermined material.

The substrate stage 120 serves to receive the substrate 100 below the printing roll 200.

The doctor roll 160 uniformly coats the predetermined material on the anilox roll 180 while rotating in engagement with the anilox roll 180.

The doctor blade 170 is in contact with the anilox roll 180 to uniformly coat the predetermined material on the anilox roll 180 in the same manner as the doctor roll 160.

If both the doctor blade 170 and the doctor roll 160 are used, it is possible to minimize uneven coating generated if the doctor roll 160 is only used as in the related art.

In other words, even though a problem occurs in that pressure in the center portion between the doctor roll 160 and the anilox roll 180 decreases and thus it fails to uniformly coat the predetermined material on the center portion of the anilox roll 180 as the size of the substrate increases, such a problem can be solved by the doctor blade 170. Also, even though a problem occurs in that a predetermined portion of the doctor roll 160 is abraded by its repeated use, such a problem can be solved by the doctor blade 170.

The doctor blade 170 may only be used to solve the problems of the doctor roll 160. However, in such case, since a contact area between the doctor blade 170 and the anilox roll 180 is smaller than a contact area between the doctor roll 160 and the anilox roll 180, it is necessary to rotate the anilox roll 180 several times for uniform coating of the predetermined material, whereby the process time increases. Also, a problem occurs in that bubbles are generated in the predetermined material if the doctor blade 170 is only used.

Accordingly, in the present invention, both the doctor roll 160 and the doctor blade 170 are used to solve the problems occurring as the doctor roll 160 or the doctor blade 170 is only used. As a result, it is possible to uniformly coat the predetermined material on the anilox roll 180.

A roll printing method using the roll printing device according to the first embodiment of the present invention will now be described.

First, the dispenser 140 dispenses the predetermined material between the doctor roll 160 and the anilox roll 180, which are rotating.

Then, the dispensed material is uniformly coated on the anilox roll 180. Such uniform coating is performed by the doctor roll 160 and the doctor blade 170, wherein the doctor roll 160 is rotating in engagement with the anilox roll 180 and the doctor blade 170 is in contact with the anilox roll 180.

Afterwards, the anilox roll 180 supplies the material to the printing roll 200 rotating in engagement with the anilox roll 180.

The printing roll 200 coats the material on the substrate 100 mounted on the substrate stage 120. Such coating may be performed by either moving the substrate stage 120 in a predetermined direction or moving the printing roll 200 on the substrate stage 120. If the size of the substrate 100 increases, it is preferable to move the printing roll 200 because the space occupied by the substrate stage is decreased.

Second Embodiment

Figure 3:
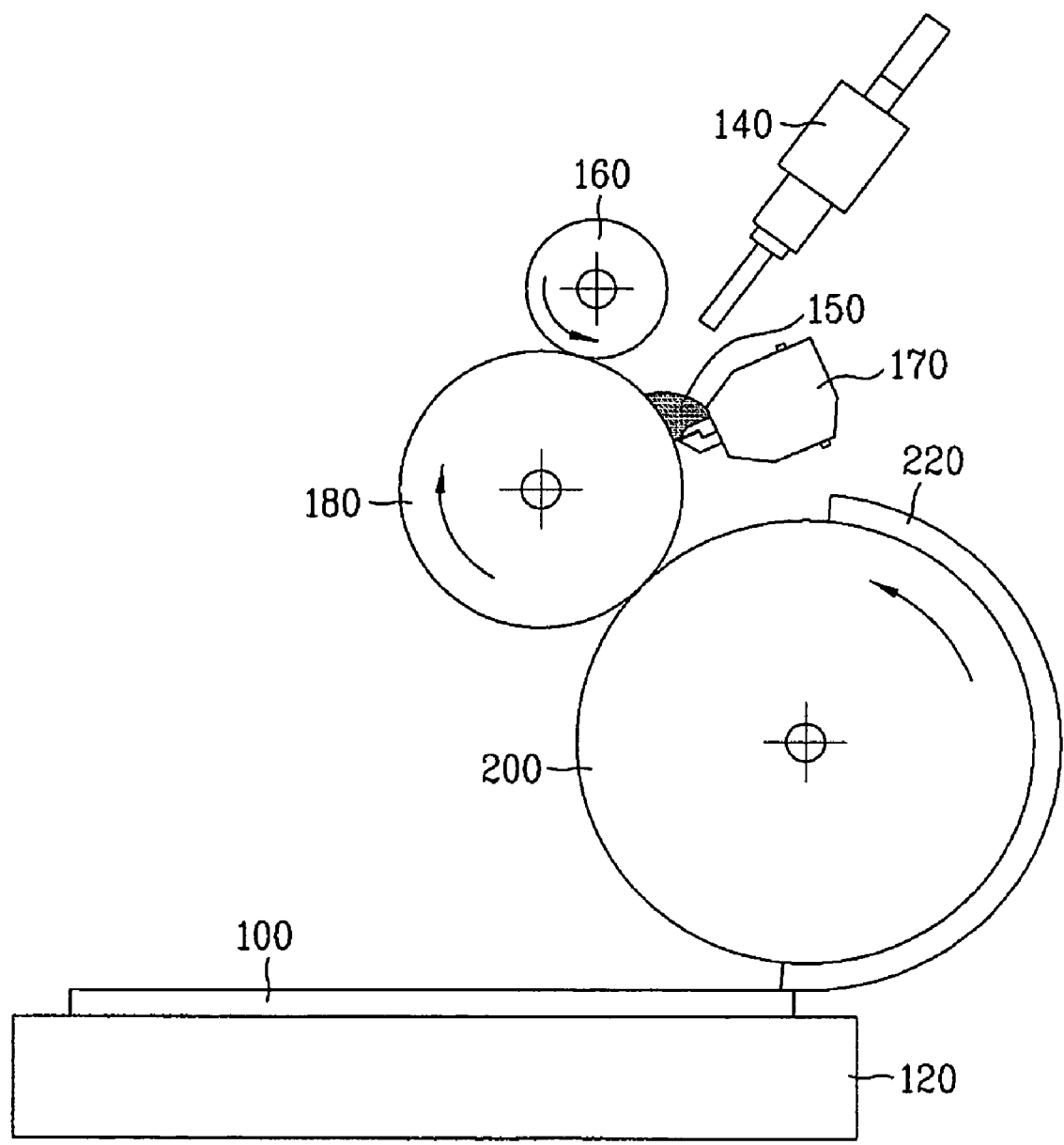
FIG. 3 is a sectional view illustrating a roll printing device according to a second embodiment of the present invention.

FIG. 3 is a sectional view illustrating a roll printing device according to a second embodiment of the present invention.

The roll printing device according to the second embodiment of the present invention is different from the roll printing device according to the first embodiment of the present invention in that the dispenser 140 is arranged to dispense a predetermined material 150 not between the anilox roll 180 and the doctor roll 160 but between the anilox roll 180 and the doctor blade 170.

Likewise, the roll printing method according to the second embodiment of the present invention is different from the roll printing method according to the first embodiment of the present invention in that the dispenser 140 is arranged to dispense a predetermined material 150 not between the anilox roll 180 and the doctor roll 160 but between the anilox roll 180 and the doctor blade 170.

Accordingly, the same reference numbers has been used throughout the drawings to refer to the same or like parts, and their detailed description will be omitted.

Third Embodiment

Figure 4:
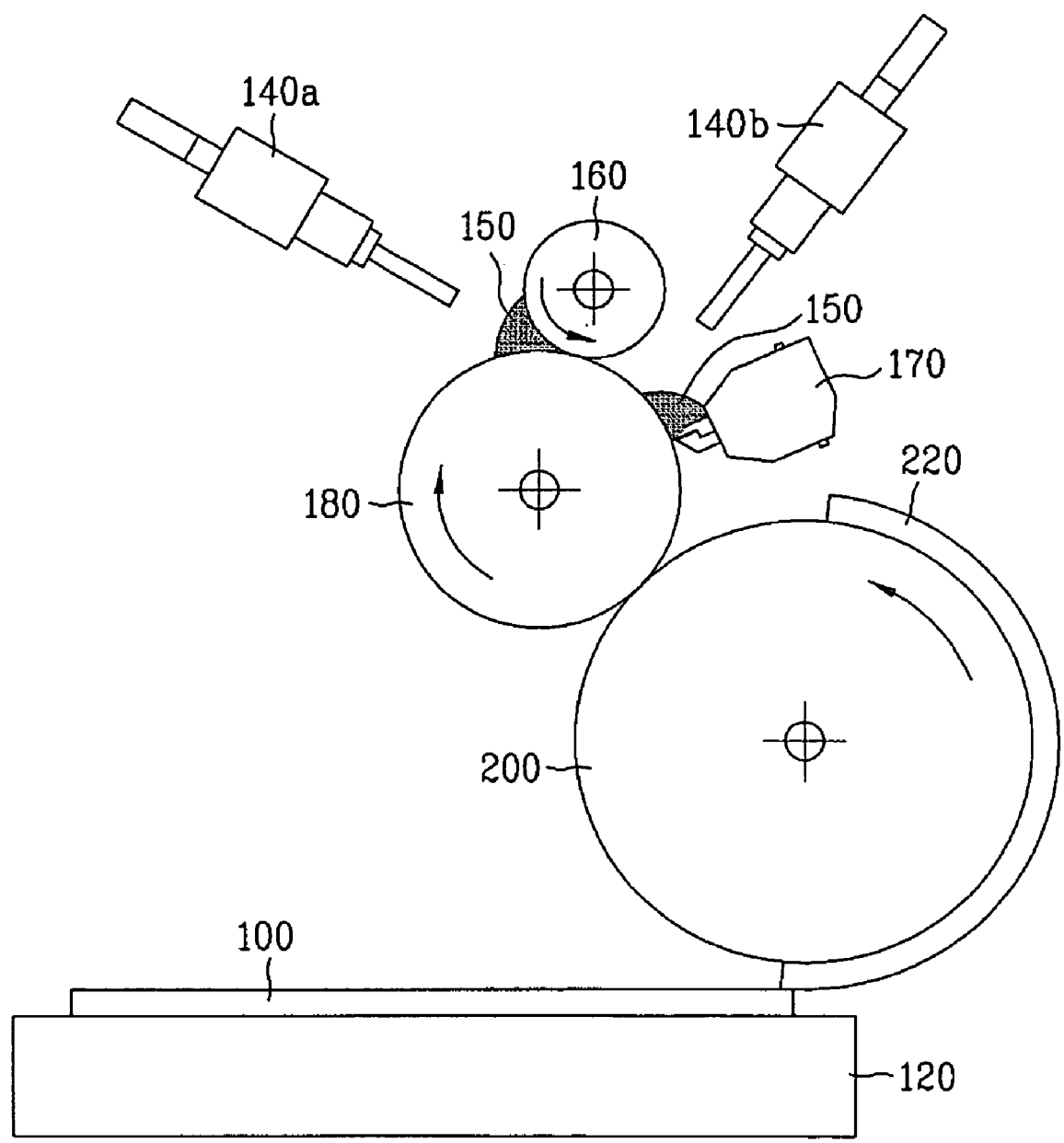
FIG. 4 is a sectional view illustrating a roll printing device according to a third embodiment of the present invention.

FIG. 4 is a sectional view illustrating a roll printing device according to a third embodiment of the present invention.

The roll printing device according to the third embodiment of the present invention is different from the roll printing device according to the first embodiment of the present invention in that a first dispenser 140a is arranged to dispense a predetermined material 150 between the anilox roll 180 and the doctor roll 160 and a second dispenser 140b is arranged to dispense the predetermined material 150 between the anilox roll 180 and the doctor blade 170.

Likewise, the roll printing method according to the third embodiment of the present invention is different from the roll printing method according to the first embodiment of the present invention in that a process of dispensing a predetermined material from a dispenser includes dispensing the predetermined material 150 between the anilox roll 180 and the doctor roll 160 and dispensing the predetermined material 150 between the anilox roll 180 and the doctor blade 170.

Accordingly, the same reference numbers has been used throughout the drawings to refer to the same or like parts, and their detailed description will be omitted.

A method of fabricating an LCD device will be described hereinafter.

First, lower and upper substrates are prepared depending on a driving mode of the LCD device.

In a case of a twisted nematic (TN) mode LCD device, the lower substrate includes gate and data lines crossing each other to define a pixel region, a thin film transistor formed at a crossing portion of the gate and data lines and serving as a switching device, and a pixel electrode formed in the pixel region, serving as one electrode for an electric field. The upper substrate includes a light-shielding layer shielding light leakage, a color filter layer for displaying color, and a common electrode serving as one electrode for an electric field.

In a case of an in-plane switching (IPS) mode LCD device, the lower substrate includes gate and data lines crossing each other to define a pixel region, a thin film transistor formed at a crossing portion of the gate and data lines and serving as a switching device, and a pair of pixel and common electrodes formed substantially in parallel in the pixel region, serving as a pair of electrodes for an electric field to form a transverse electric field. The upper substrate includes a light-shielding layer shielding light leakage, and a color filter layer for displaying color.

Afterwards, an alignment layer is coated on at least one of the lower and upper substrates using the aforementioned roll printing method. In this case, an alignment material is used as a predetermined material.

Then, an alignment direction of the alignment layer is uniformly aligned using a rubbing alignment method or a photo-alignment method.

A liquid crystal layer is formed between the substrates by a vacuum injection method or a liquid crystal dropping method.

The vacuum injection method includes forming a sealant having an injection hole on any one of the substrates, bonding the substrates to each other, and injecting a liquid crystal into the bonded substrates through the injection hole of the sealant.

The liquid crystal dropping method includes forming a sealant on any one of the substrates, dropping a liquid crystal onto any one of the substrates, and bonding the substrates to each other.

As described above, the roll printing device, the roll printing method, and the method of fabricating the LCD device using the same according to the present invention have the following advantages.

First, the problems of the doctor roll can be solved by the doctor blade.

In other words, even though the problem occurs in that the pressure in the center portion between the doctor roll and the anilox roll decreases and thus it fails to uniformly coat the predetermined material on the center portion of the anilox roll as the size of the substrate increases, such a problem can be solved by the doctor blade. Also, even though the problem occurs in that the predetermined portion of the doctor roll is abraded by its repeated use, such a problem can be solved by the doctor blade.

In addition, the problems of the doctor blade can be solved by the doctor roll.

In other words, since the contact area between the doctor blade and the anilox roll is smaller than that between the doctor roll and the anilox roll, it is necessary to rotate the anilox roll several times for uniform coating of the predetermined material, whereby the process time increases. In this case, it is possible to reduce the process time by using both the doctor blade and the doctor roll. Also, the problem occurs in that bubbles are generated in the predetermined material if only the doctor blade is used. Since the bubbles are removed by rotation of the doctor roll, it is possible to uniformly coat the predetermined material on the anilox roll.

It will be apparent to those skilled in the art that various modifications and variations can be made in the present invention without departing from the spirit or scope of the inventions. Thus, it is intended that the present invention cover the modifications and variations of this invention provided they come within the scope of the appended claims and their equivalents.

What is claimed:

1. A roll printing device comprising:
   a dispenser;
   an anilox roll receiving a predetermined material dispensed from the dispenser;
   a doctor roll rotating in engagement with the anilox roll to uniformly coat the predetermined material on the anilox roll;
   a doctor blade in contact with the anilox roll to uniformly coat the predetermined material on the anilox roll; and
   a printing roll supplied with the predetermined material from the anilox roll.

2. The roll printing device as claimed in claim 1, wherein the dispenser is arranged to dispense the predetermined material between the anilox roll and the doctor roll.

3. The roll printing device as claimed in claim 1, wherein the dispenser is arranged to dispense the predetermined material between the anilox roll and the doctor blade.

4. The roll printing device as claimed in claim 1, wherein the dispenser includes a first dispenser arranged to dispense the predetermined material between the anilox roll and the doctor roll and a second dispenser arranged to dispense the predetermined material between the anilox roll and the doctor blade.

5. The roll printing device as claimed in claim 1, further comprising a substrate stage formed below the printing roll, wherein a substrate is mounted on the substrate stage.

6. The roll printing device as claimed in claim 1, wherein the printing roll is attached with a printing mask suitable for a coating pattern of a desired alignment material.

7. A roll printing method comprising:
   dispensing a predetermined material from a dispenser to an anilox roll;
   uniformly coating the predetermined material on the anilox roll;
   supplying the predetermined material from the anilox roll to a printing roll rotating in engagement with the anilox roll; and
   coating the predetermined material from the printing roll on a substrate mounted on a substrate stage,
   wherein uniformly coating the predetermined material is performed by a doctor roll rotating in engagement with the anilox roll and a doctor blade in contact with the anilox roll.

8. The roll printing method as claimed in claim 7, wherein the dispensing includes dispensing the predetermined material between the anilox roll and the doctor roll.

9. The roll printing method as claimed in claim 7, wherein the dispensing includes dispensing the predetermined material between the anilox roll and the doctor blade.

10. The roll printing method as claimed in claim 7, wherein the dispensing includes dispensing the predetermined material between the anilox roll and the doctor roll and dispensing the predetermined material between the anilox roll and the doctor blade.

11. The roll printing method as claimed in claim 7, wherein the coating is performed by moving the substrate stage.

12. The roll printing method as claimed in claim 7, wherein the coating is performed by moving the printing roll.

13. A method of fabricating an LCD device, comprising:
    preparing lower and upper substrates;
    coating an alignment layer on at least one of the lower and upper substrates; and
    forming a liquid crystal layer between the lower and upper substrates,
    wherein the coating of the alignment layer includes:
    dispensing an alignment material from a dispenser to an anilox roll;
    uniformly coating the alignment material on the anilox roll;
    supplying the alignment material from the anilox roll to a printing roll rotating in engagement with the anilox roll; and
    coating the alignment material from the printing roll on a substrate mounted on a substrate stage,
    wherein the uniformly coating of the alignment material is performed by a doctor roll rotating in engagement with the anilox roll and a doctor blade being in contact with the anilox roll.

14. The method as claimed in claim 13, wherein the forming of the liquid crystal layer includes:
    forming a sealant having no injection hole on any one of the lower and upper substrates;
    dropping a liquid crystal onto any one of the lower and upper substrates; and
    bonding the lower and upper substrates to each other.

15. The method as claimed in claim 13, wherein the forming of the liquid crystal layer includes:
    forming a sealant having an injection hole on any one of the lower and upper substrates;
    bonding the lower and upper substrates to each other; and
    injecting a liquid crystal between the lower and upper substrates through the injection hole.

16. The method as claimed in claim 13, wherein the dispensing includes dispensing the alignment material between the anilox roll and the doctor roll.

17. The method as claimed in claim 13, wherein the dispensing includes dispensing the alignment material between the anilox roll and the doctor blade.

18. The method as claimed in claim 13, wherein the dispensing includes dispensing the alignment material between the anilox roll and the doctor roll and dispensing the alignment material between the anilox roll and the doctor blade.

19. The method as claimed in claim 13, wherein the coating of the alignment material from the printing roll is performed by moving the substrate stage.

20. The method as claimed in claim 13, wherein the coating of the alignment material from the printing roll is performed by moving the printing roll.

* * * * *